United States Patent
Salman et al.

(10) Patent No.: US 7,205,165 B1
(45) Date of Patent: Apr. 17, 2007

(54) METHOD FOR DETERMINING THE RELIABILITY OF DIELECTRIC LAYERS

(75) Inventors: Akram Ali Salman, Sunnyvale, CA (US); Xuejun Zhao, Sunnyvale, CA (US); Kurt O. Taylor, San Jose, CA (US); Stephen G. Beebe, Mountain View, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 32 days.

(21) Appl. No.: 10/664,665

(22) Filed: Sep. 18, 2003

(51) Int. Cl.
*H01L 27/00* (2006.01)

(52) U.S. Cl. .......................... 438/10; 438/14; 438/19; 438/17

(58) Field of Classification Search ............... 438/17, 438/19, 14, 10
See application file for complete search history.

(56) References Cited

U.S. PATENT DOCUMENTS

| | | | |
|---|---|---|---|
| 5,208,453 A * | 5/1993 | Hostetler | 250/214 LA |
| 5,433,790 A * | 7/1995 | Niino et al. | 118/723 MW |
| 5,804,975 A * | 9/1998 | Alers et al. | 324/613 |
| 6,602,729 B2 * | 8/2003 | Lin | 438/17 |

OTHER PUBLICATIONS

B.P. Linder et al "Gale Oxide Breakdown under Current Limited Constant Voltage Stress" 2000 Symposium on VLSI Tech Digest of Technical Papers pp. 214-215.*
Salman et al., "Gate Dielectric Breakdown and Latent Failures of Ultrathin (~13A) DPN under Pulsed Stress in Partially Depleted SOI MOSFETs".
Wu et al., "Breakdown and Latent Damage of Ultra-Thin Gate Oxides under ESD Stress Conditions," EOS/ESD Symposium 00-287-295.
Montoya et al., "A Study of the Mechanisms for ESD Damage to Reticles," EOS/ESD Symposium 00-394-405.
Hunter, "The Analysis of Oxide Reliability Data," 98 IRW Final Report, 114-34.
Linder et al., "Growth and Scaling of Oxide Conduction after Breakdown," 2003 IEEE, 402-05.
Alam and Smith, "A Phenomenological Theory of Correlated Multiple Soft-Breakdown Events in Ultra-Thin Gate Dielectrics," 2003 IEEE, 406-411.

* cited by examiner

*Primary Examiner*—Laura M. Schillinger
(74) *Attorney, Agent, or Firm*—Williams, Morgan & Amerson, P.C.

(57) ABSTRACT

The present invention is generally directed to various methods for determining the reliability of dielectric layers. In one illustrative embodiment, the method comprises providing a device having a dielectric layer, applying a plurality of constant voltage pulses to the device and measuring a current through the dielectric layer after one or more of the constant voltage pulses has been applied.

26 Claims, 3 Drawing Sheets

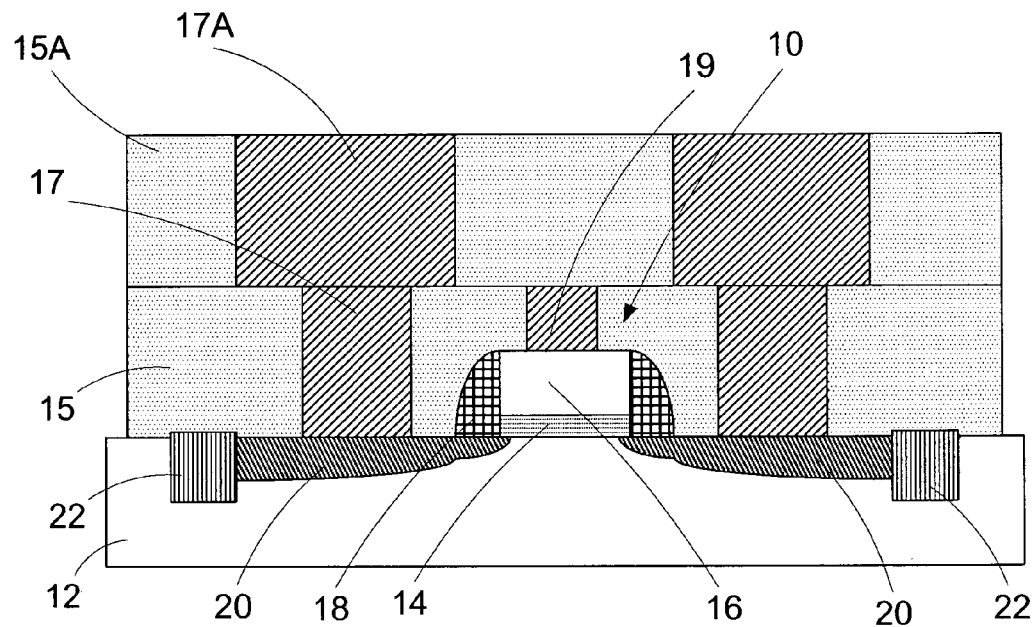
(Prior Art) Figure 1
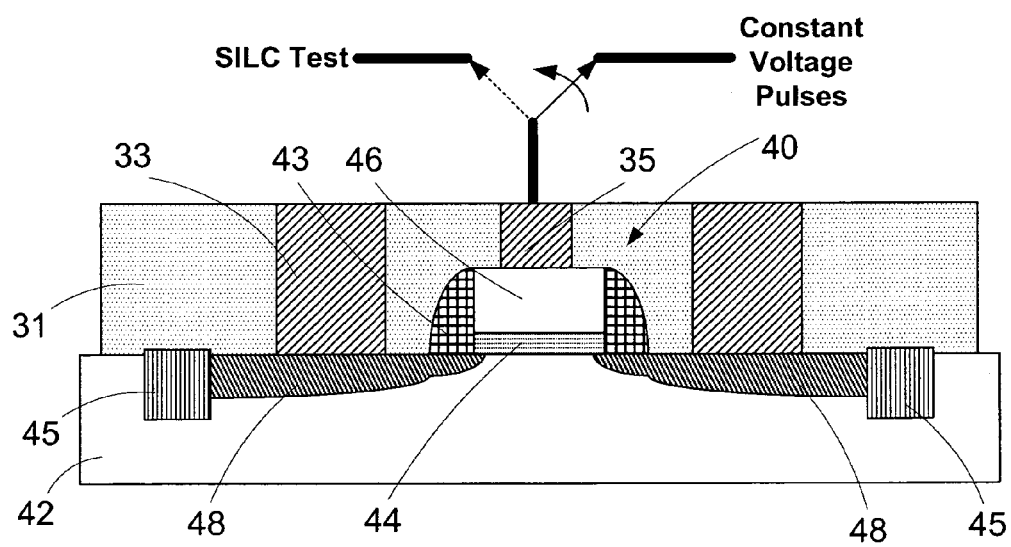
Figure 3

METHOD FOR DETERMINING THE RELIABILITY OF DIELECTRIC LAYERS

BACKGROUND OF THE INVENTION

1. Field of the Invention

This invention relates generally to the field of semiconductor device manufacturing and, more particularly, to a method for determining the reliability of dielectric layers.

2. Description of the Related Art

There is a constant drive within the semiconductor industry to increase the quality, reliability, performance and throughput and to reduce the cost of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

By way of background, FIG. 1 depicts an illustrative transistor 10 that may be found in many modern integrated circuit devices. The transistor 10 is formed above a substrate 12 and it is generally comprised of a dielectric layer 14, a gate electrode 16, sidewall spacers 18 and source/drain regions 20. The substrate 12 may be a bulk semiconductor substrate, or it may be a silicon-on-insulator (SOI) substrate. An isolation region 22 is typically established around the transistor 10 to electrically isolate it from other transistors formed on the substrate 12. A layer of insulating material 15, e.g., silicon dioxide, is formed above the substrate 12, and conductive contacts 17 are provided to the source and drain regions 20. A contact 19 is also provided to the gate electrode 16. However, in an actual device, the gate contact 19 may not be in the same plane as the source/drain contacts 17, as indicated in FIG. 1. Nevertheless, FIG. 1 is provided to describe an illustrative example of a prior art transistor 10. Typically, a modern integrated circuit device, such as a microprocessor, may be comprised of millions of transistors 10 like the one depicted in FIG. 1. Additionally, a completed device may have many additional metallization layers formed above the transistors. Another illustrative conductive interconnection level of metal line 17A is formed in the dielectric layer 15A. The exact configuration of these multiple layers of metal may vary depending on the particular application. However, it should be understood that a completed integrated circuit device may be comprised of many interlevel and intralevel dielectric layers having conductive lines and vias formed therein.

As set forth previously, there is a constant drive within the industry to increase the performance capability of integrated circuit devices. To that end, great efforts have been made to increase the performance capability of such transistors 10. All other things being equal, the smaller the gate length of the transistor 10, the faster it will operate. Current-day, cutting-edge integrated circuit devices employ transistors 10 having a gate length on the order of approximately 0.06–0.08 μm, and further reductions in the gate length are planned in the future. However, the drive to increase the performance capabilities of the transistor 10 has also necessitated changes in other components of the transistor 10 as well. For example, all other things being equal, the thinner the dielectric layer 14, the faster the transistor 10 will operate. Typically, for current high speed transistor design, the dielectric layer 14 may have a thickness that ranges from approximately 1.5 nm and less, and further reductions are planned in the future. Moreover, there is great deal of investigation into alternative materials and methods of making dielectric layers such that improved performance capabilities may be realized. Typically, the dielectric layer 14 will be made from a material such as silicon dioxide, or a layer of silicon dioxide having an enhanced nitrogen concentration. There is also investigation into using various so-called "high-k" dielectric materials for the dielectric layer, e.g., dielectric layers having a dielectric constant greater than 5.

Given the importance of dielectric layers with respect to performance of the completed device, there has always been great interest in ensuring that high quality, reliable dielectric layers 14 can be manufactured for use in such applications. To that end, typically, semiconductor device manufacturers conduct many tests in an effort to determine and ensure the reliability of such dielectric layers. One such test attempts to evaluate the qualities and capabilities of the dielectric layers 14 by subjecting the dielectric layer 14 to a constant voltage over a relatively long period of time until a relatively sharp increase in gate current (Ig) can be detected, i.e., the so-called breakdown point of the dielectric layer 14. This testing is generally known as time-dependent dielectric breakdown (TDDB) testing. Using this methodology, a relatively low voltage, e.g., on the order of approximately 3 volts, may be constantly applied to the gate electrode, and the gate current may be constantly monitored to determine when breakdown has occurred. Such testing is normally performed on hundreds, if not thousands, of test structures. Unfortunately, such testing can take a very long time, e.g., on the order of several weeks or two-three months, to complete due to the time it takes for the dielectric layers to actually reach the breakdown point. The results of such tests are typically analyzed using known statistical techniques to determine the reliability and quality of the dielectric layer. Dielectric layers may also be subjected to additional testing to further evaluate the quality of the dielectric, such as, for example, area scaling, voltage scaling, temperature scaling, etc.

Unfortunately, as the thickness of the dielectric layer 14 continues to decrease, the traditional TDDB methodology of testing for breakdown of the dielectric layer 14 has proven to be less effective than desirable. That is, for very thin dielectric layers, e.g., on order of approximately 3.0 nm and less, there is a phenomenon known as the soft breakdown that makes it very difficult to detect exactly when breakdown of the dielectric layer 14 occurs. Dielectric breakdown is associated with an increase in gate current, i.e., a current that flows from the gate electrode 16 and through the dielectric layer 14. For very thin dielectric layers, e.g., less than or equal to approximately 3.0 nm, the gate leakage current operates via a direct tunneling mechanism. Thus, there is no longer a clear time-to-breakdown (TBD) point in the gate current (Ig) degradation curve for such thin dielectric layers. However, time-to-breakdown (TBD) is the most important parameter for a given voltage. Of course, the prior art method of using constant voltage TDDB methodologies can still be employed on very thin dielectric layers, but the time at which the dielectric layer begins to degrade is difficult to detect using such methodologies because of the soft breakdown phenomenon described above.

The present invention is directed to overcoming, or at least reducing the effects of, one or more of the problems set forth above.

SUMMARY OF THE INVENTION

The present invention is generally directed to various methods for determining the reliability of dielectric layers. In one illustrative embodiment, the method comprises providing a device having a dielectric layer, applying a plurality of constant voltage pulses to the device and determining a time-to-breakdown for the dielectric layer based upon a number of pulses applied to the device until the dielectric layer breaks down.

In another illustrative embodiment, the method comprises providing a device having a dielectric layer, applying a plurality of constant voltage pulses to the device and measuring a current through the dielectric layer after one or more of the constant voltage pulses has been applied. In further embodiments, the method further comprises determining a breakdown point for the dielectric layer based upon the measured current and determining a time-to-breakdown for the dielectric layer based upon a number of pulses applied to the device until the dielectric layer breaks down.

In yet another illustrative embodiment, the method comprises providing a device having a dielectric layer, applying a plurality of constant voltage pulses to the device, each of the pulses having a constant pulse width, and measuring a current through the dielectric layer after each of the constant voltage pulses has been applied.

In a further illustrative embodiment, the method comprises providing a device having a dielectric layer, applying a plurality of constant voltage pulses to the device, each of the pulses having a constant voltage that ranges from approximately 4–5 volts and a constant pulse width that is less than 1 μsec, and measuring a current through the dielectric layer after each of the constant voltage pulses has been applied.

BRIEF DESCRIPTION OF THE DRAWINGS

The invention may be understood by reference to the following description taken in conjunction with the accompanying drawings, in which like reference numerals identify like elements, and in which:

FIG. 1 is a schematic depiction of an illustrative prior art transistor device;

FIG. 3 is an enlarged view of an illustrative device that may be tested in accordance with the methodologies described herein;

Figure 2:
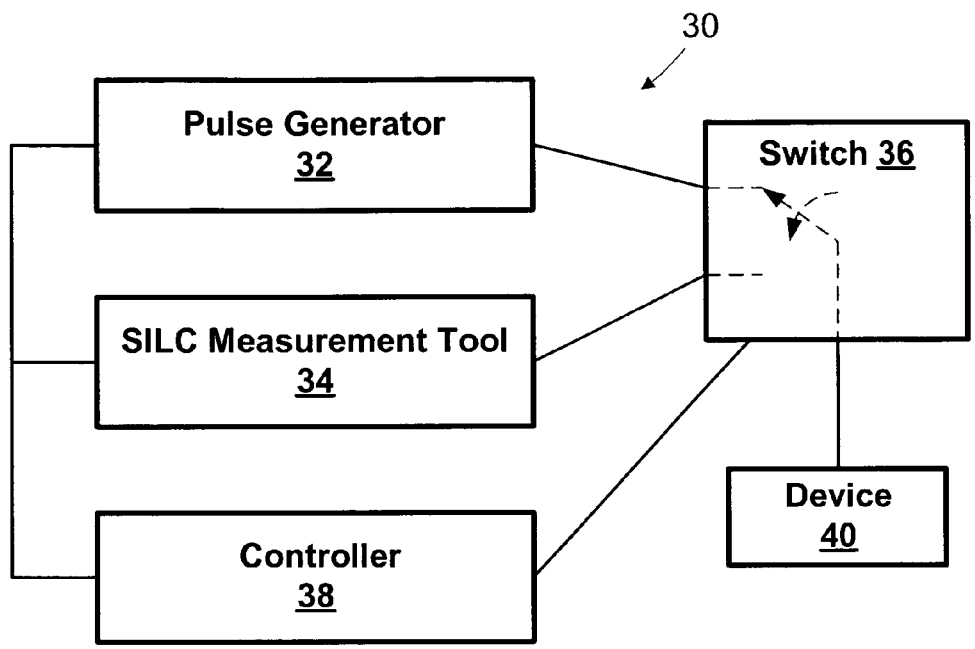
FIG. 2 is a schematic depiction of an illustrative system that may be used in determining the reliability of dielectric layers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods for determining the reliability of dielectric layers. As will be readily apparent to those skilled in the art upon a complete reading of the present application, the present methods are applicable to a variety of technologies, e.g., NMOS, PMOS, CMOS, etc., and to the formation of a variety of devices, including, but not limited to, logic devices, memory devices, etc. More specifically, the present invention may be employed in forming dielectric layers that may be used on a variety of semiconductor devices, e.g., transistors, capacitors, resistors, memory cells, etc. However, for purposes of explanation, the present invention will be discussed in the context of a dielectric layer that serves as a gate insulation layer for an illustrative transistor. However, the present invention should not be considered as limited to such an embodiment unless such a limitation is expressly set forth in the appended claims. That is, the present invention may be employed with respect to the testing of any dielectric layer formed at any location in an integrated circuit device. For example, the present invention may be employed in connection with evaluating dielectric layers that serve as gate insulation layers or dielectric layers that serve as interlevel or intralevel dielectric layers in various conductive interconnection structures. Thus, the present invention should not be considered as limited to any particular dielectric material, or the intended use of such a dielectric material, unless such limitations are expressly set forth in the appended claims.

FIG. 2 depicts an illustrative test system 30 that may be employed in accordance with the present invention to evaluate the reliability of dielectric layers. FIG. 3 depicts an illustrative device 40 that may be subjected to the testing described herein using the system 30 depicted in FIG. 2. In general, the system 30 is comprised of a pulse generator 32, a stress-induced leakage current (SILC) measurement tool 34, a switch 36 and a controller 38. It should be understood that the device 40 depicted in FIG. 2 is representative in nature of many such devices, e.g., hundreds or thousands, that may be subjected to such testing in order to acquire enough data to make reliable assessments regarding the reliability of the dielectric layers tested. Typically, the device 40 is a test structure that is formed on a semiconducting substrate, e.g., an SOI substrate or a bulk silicon substrate. However, in some cases, it may be possible to perform the testing described herein on actual production devices, although modifications may have to be made due to the complexity of the completed devices.

The illustrative device 40 depicted in FIG. 3 should also be understood to be representative in nature in that it may represent any of a variety of different types of semiconductor devices that employ dielectric layers. As shown herein, the illustrative device 40 is a transistor comprised of a gate electrode 46, a dielectric layer 44, sidewall spacers 43 and source/drain regions 48. The device 40 is formed above a semiconducting substrate 42 and it may be electrically isolated from other components by the trench isolation region 45 formed in the substrate 42. Also depicted in FIG. 3 is a layer of insulating material 31, source/drain contacts 33, and a gate contact 35.

The dielectric layer 44 may be comprised of a variety of materials, and it may be manufactured by a variety of techniques. Moreover, the thickness of the dielectric layer 44 may, in some cases, be less than or equal to 1.5 nm for modern high performance devices. For example, the dielectric layer 44 may be silicon dioxide, a layer of silicon dioxide with an enhanced concentration of nitrogen, or a so-called "high-k" dielectric material, i.e., a material having a dielectric constant greater than 5. In some cases, the dielectric layer 44 may be comprised of two or more separate layers that may be made of different materials. The dielectric layer 44 may be manufactured using a variety of known processing techniques, such as thermal growth processes, or by performing a variety of deposition processes, such as atomic layer deposition (ALD), chemical vapor deposition (CVD), plasma enhanced chemical vapor deposition (PECVD), spin-on deposition techniques, etc. Thus, the present invention should not be limited to any particular type of material for the dielectric layer or the manner in which such dielectric layers are made, unless such limitations are expressly set forth in the appended claims.

In general, the pulse generator 32 may be used to apply, in one embodiment, a constant voltage pulse, of a constant pulse width, to the device 40 to induce stress on the dielectric layer 44. The pulse generator 32 may be any of a variety of commercially available systems for generating such voltage pulses. In one illustrative embodiment, the pulse generator 32 is an HP 8114A pulse generator manufactured by Hewlett-Packard. The magnitude of the voltage generated by the pulse generator 32 may vary depending upon the application. With respect to current-day technology, wherein the operating voltage is on the order of approximately 1–2 volts, the pulse generator 32 may generate pulses having a voltage that ranges from approximately 4–5 volts. Note that the magnitude of the voltage pulses used in accordance with the present invention is typically higher than the voltage level applied during the constant voltage TDDB testing described in the background section of the application. Moreover, the width of the pulses generated by the pulse generator may also vary depending upon the particular application. In general, the width of the pulses will be less than 1 μsec. Generally, the lesser the pulse width, the better the resolution of the testing techniques described herein. In one illustrative embodiment, the pulse generator 32 may be configured to generate voltage pulses that have a pulse width of approximately 100 ns. The pulse generator 32 is coupled to the gate electrode 46 of the transistor 40 and the source and drain regions 48 are connected to the opposite terminal during the testing processes described herein.

The SILC measurement tool 34 may any of a variety of commercially available devices that is capable of measuring the gate current of the device 40. In one illustrative embodiment, the SILC measurement tool 34 is a Model No. HP4156 semiconductor parameter analyzer manufactured by Hewlett Packard, which includes a source monitor unit (SMU). The SILC measurement tool 34 is also coupled to the gate electrode 46. In general, the SILC measurement tool 34 will be used to measure the gate current, i.e., the current flowing through the dielectric layer 44, after the dielectric layer 44 has been subjected to one or more of the voltage pulses generated by the pulse generator 32. Typically, this will be accomplished by using the SILC measurement tool 34 to apply a constant voltage, e.g., 1–2 volts, on the gate electrode 46 and to measure the gate current. This testing of the gate current is performed very quickly, e.g., on the order of one second for each test. In one particularly illustrative example, the SILC measurement tool 34 may be used to measure the gate current for the device 40 after each pulse generated by the pulse generator 32. However, testing after every pulse need not be required in all cases. For example, during the early portions of the test, when dielectric breakdown is less likely to occur, the measurement of the gate current may be made less frequently, e.g., after every fourth pulse. Thereafter, as the testing continues, the gate current may be tested more frequently to investigate the soft breakdown phenomenon described previously. Thus, the present invention should not be limited to any particular testing protocol unless such limitations are clearly set forth in the appended claims.

The controller 38 depicted in FIG. 2 controls the operation of the system 30. To that end, the controller 38 operates the switch 36 between the pulse generator 32 and the SILC measurement tool 34 as necessary depending upon the particular testing methodology and protocol selected. For example, in the case where the gate current is measured after every pulse, the controller 38 flips the switch 36 between the pulse generator 32 and the SILC measurement tool 34 after every pulse, then back again to the pulse generator 32 after the gate current is measured by the SILC measurement tool 34.

Figure 4:
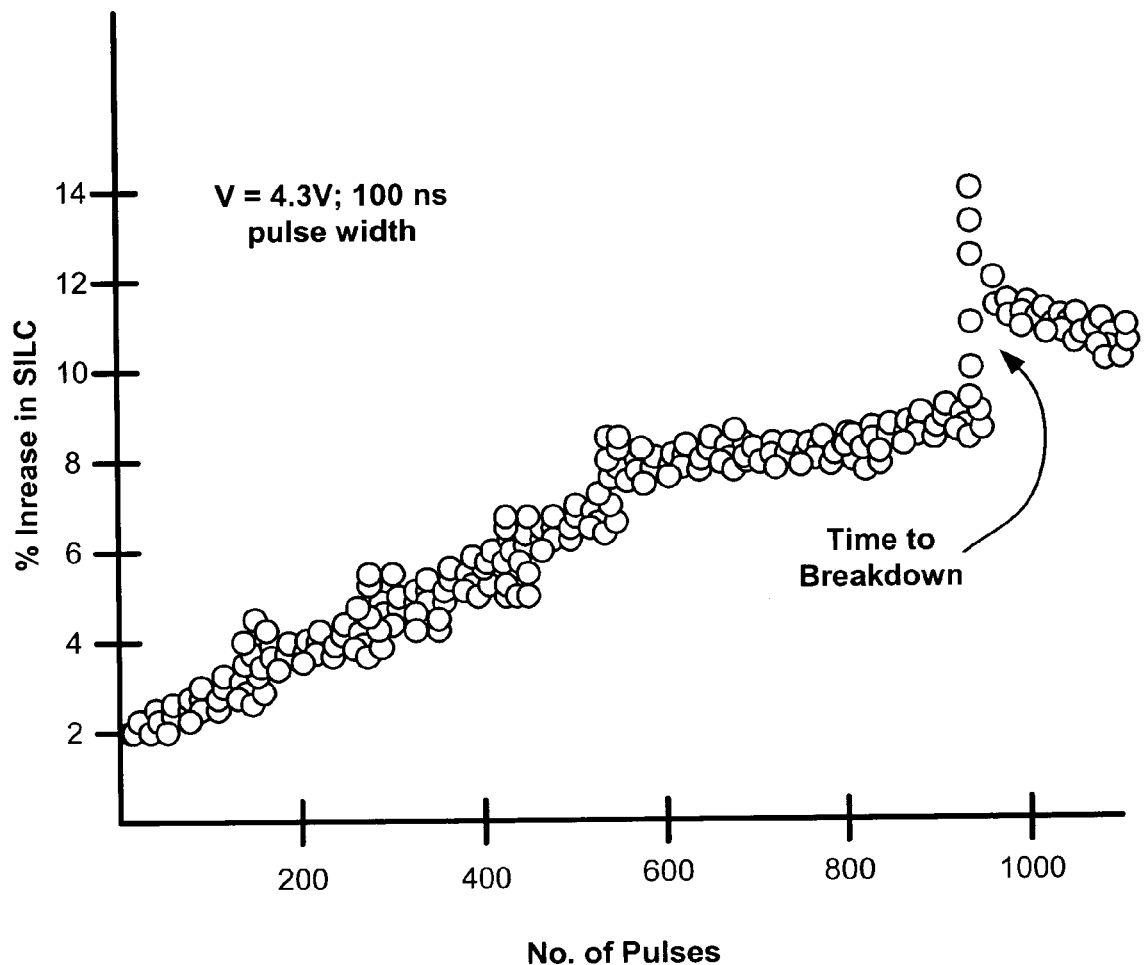
FIG. 4 is a graph depicting one illustrative example of the dielectric reliability data that may be obtained in accordance with one embodiment of the present invention.

As set forth previously, evaluating the quality and reliability of dielectric layers may involve testing hundreds or thousands of samples to obtain a sufficient database that may be analyzed using known statistical techniques to determine the reliability of the dielectric layers 44. In the particular example depicted in FIG. 4, the data points reflect testing of many devices wherein the voltage pulses generated by the pulse generator 32 were generated at a voltage of approximately 4.3 volts and the pulse width was set at approximately 100 ns. In FIG. 4, the horizontal axis reflects the number of constant voltage pulses applied, while the vertical axis represents the percentage increase of the gate current relative to the gate current at time zero ($\Delta I_g/I_{g0}$). Each of the points reflects the measurement of the gate current after one or more pulses have been applied to the device 40. As can be seen in FIG. 4, the stress-induced leakage current, resulting from the pulses applied by the pulse generator 32, causes a gradual increase in the gate leakage current. The ultimate point of breakdown for the dielectric layer can be seen occurring after approximately 950 pulses have been applied to the device. The lifetime of the dielectric layer 44 can be readily determined by multiplying the number of pulses applied until breakdown occurs and the pulse width employed during the testing. In the context of the present invention, breakdown of the dielectric layer is understood to occur when there is an abrupt increase in the gate leakage current.

The methodologies described herein allow determining the reliability of dielectric layers much more quickly than with the prior art constant voltage TDDB method described in the background section of the application. More specifically, using the present techniques, dielectric layers may be evaluated for breakdown purposes in approximately 2–3 hours, as compared to weeks or months taken using the prior art TDDB approach. This may be accomplished because of the increased resolution and the ability to employ higher voltage levels that is achievable with the present testing methodology as compared to the prior art techniques. That is, through use of the pulsed voltage techniques described herein, particularly at the relatively higher voltage levels of approximately 4–5 volts, breakdown may be more easily determined for very thin dielectric layers.

Although the present invention has been disclosed in the context of measuring the breakdown of dielectric layers, the invention is not so limited. Rather, as will be recognized by those skilled in the art after a complete reading of the present application, the methodologies and systems disclosed herein may be employed in determining the reliability of dielectric layers by examining other characteristics of such dielectric layers. For example, the present invention may also be employed in the context of voltage scaling, area scaling and temperature scaling testing. In voltage scaling, different devices 40 are subjected to voltage pulses at different voltage levels to determine the reliability of the dielectric layers. That is, in accordance with the present invention, one device 40 (or group of devices 40) may be subjected to voltage pulses at a first constant voltage, while a second device 40 (or group of devices 40) may be subjected to voltage pulses at a second, higher voltage. In general, as applied voltages are increased, the reliability of the dielectric layers decreases. In area scaling evaluation, devices 40 (or groups of devices 40) having differing coverage areas (one group having an area larger than the other group) are subjected to the constant voltage pulses described herein. In general, as the area occupied by the dielectric layer increases, the reliability of the dielectric layer decreases. Lastly, temperature scaling involves stressing the dielectric layers using the constant voltage pulse techniques described herein while varying the temperature of the devices. In general, as temperature increases, dielectric reliability decreases.

Figure 5:
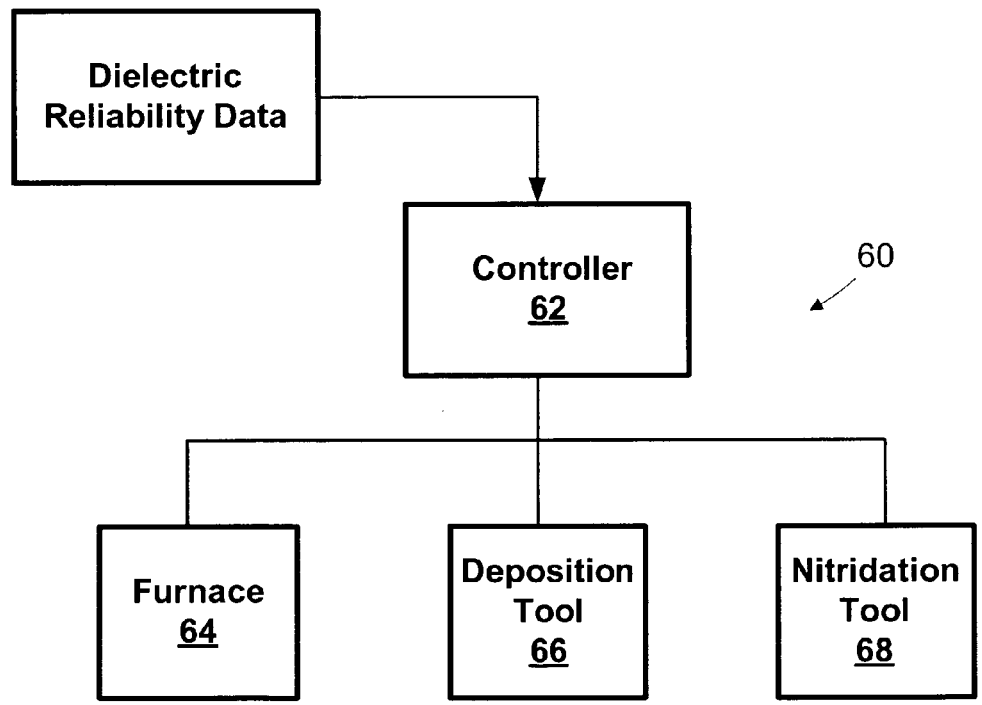
FIG. 5 is a schematic depiction of an illustrative system that may be used in accordance with the present invention to manufacture higher quality dielectric layers on integrated circuit devices.

FIG. 5 depicts an illustrative system 60 wherein the dielectric reliability data obtained using the methodologies described herein may be used to control, i.e., modify, determine, or confirm, one or more process parameters of one or more process operations used to form dielectric layers 44 on subsequently processed production devices. For example, dielectric layers 44 may be formed by performing a thermal growth process or by performing one or more deposition processes, e.g., ALD, CVD, PECVD, etc. To that end, the controller 62 depicted in FIG. 5 may control one or more operational aspects of various illustrative process tools, such as a furnace 64, a deposition tool 66 and a nitridation tool 68. That is, the controller 62 may use the dielectric reliability data to control one or more operational parameters, such as temperature, duration, pressure, applied voltages, the composition of process gases, etc., used in making dielectric layers 44 on subsequent production devices. For example, in some cases, the furnace 64 may be used to thermally grow a layer of silicon dioxide that serves as the dielectric layer 44 for a high performance microprocessor. In that situation, the temperature of the furnace 64, the duration of the thermal growth process and/or ambient conditions within the furnace 64 may be controlled based upon the dielectric reliability data obtained using the methodologies described herein. Similarly, the deposition tool 66 may be used to deposit a dielectric layer 44, such as silicon dioxide, that may be used as gate insulation layers for modern transistors or as an interlevel or intralevel dielectric layer in a metallization structure. In that embodiment, one or more parameters of the deposition process may be controlled, such as temperature, pressure, the composition and concentration of the process gases, process duration, etc. As yet another example, in other embodiments, it has been found desirable to increase the concentration of nitrogen in a gate insulation layer comprised of silicon dioxide. The increased nitrogen content tends to produce a dielectric layer with a higher dielectric constant (K). To that end, the nitridation tool 68 may be a rapid thermal nitridation (RTN) tool, a remote plasma nitridation (RPN) tool, or a decoupled plasma nitridation (DPN) tool. Some of these tools may involve positioning a substrate having a previously formed dielectric layer formed thereabove, in the nitridation tool 68, and establishing a nitrogen-rich ambient and a plasma within the tool 68.

An exemplary information exchange and process control framework suitable for use in the manufacturing system 60 is an Advanced Process Control (APC) framework, such as may be implemented using the Catalyst system formerly offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The present invention is generally directed to method for determining the reliability of dielectric layers. The methodologies disclosed herein may be applied to individual devices or to a collection of such devices. The results of the testing described herein may be analyzed to determine a time-to-breakdown for the dielectric layers subjected to such testing. In further embodiments, the time-to-breakdown information obtained using the methods disclosed herein may be used to control, i.e., vary, determine or adjust, one or more parameters of one or more process operations performed to form dielectric layers on subsequently processed substrates. In one illustrative embodiment, the method comprises providing a device having a dielectric layer, applying a plurality of constant voltage pulses to the device and determining a time-to-breakdown for the dielectric layer based upon a number of pulses applied to the device until the dielectric layer breaks down.

In another illustrative embodiment, the method comprises providing a device having a dielectric layer, applying a plurality of constant voltage pulses to the device and measuring a current through the dielectric layer after one or more of the constant voltage pulses has been applied. In further embodiments, the method comprises determining a breakdown point for the dielectric layer based upon the measured current and determining a time-to-breakdown for the dielectric layer based upon a number of pulses applied to the device until the dielectric layer breaks down.

In yet another illustrative embodiment, the method comprises providing a device having a dielectric layer, applying a plurality of constant voltage pulses to the device, each of the pulses having a constant pulse width, and measuring a current through the dielectric layer after each of the constant voltage pulses has been applied.

In still another illustrative embodiment, the method comprises providing a device having a dielectric layer, applying a plurality of constant voltage pulses to the device, each of the pulses having a constant voltage that ranges from approximately 4–5 volts and a constant pulse width that is less than 1 μsec, and measuring a current through the dielectric layer after each of the constant voltage pulses has been applied.

In a further illustrative embodiment, the method comprises providing a plurality of devices, each of which have a dielectric layer, applying a plurality of constant voltage pulses to each of the devices and, for each of the plurality of devices, measuring a current through the dielectric layer after one or more of the constant voltage pulses has been applied.

In yet a further illustrative embodiment, the method comprises providing a plurality of devices, each of which have a dielectric layer, applying a plurality of constant voltage pulses to each of the devices, each of the pulses having a constant pulse width, and, for each of the plurality of devices, measuring a current through the dielectric layer after each of the constant voltage pulses has been applied.

In still a further illustrative embodiment, the method comprises providing a plurality of devices, each of which have a dielectric layer, applying a plurality of constant voltage pulses to each of the devices, each of the pulses having a constant voltage that ranges from approximately 4–5 volts and a constant pulse width that is less than 1 μsec, and, for each of the plurality of devices, measuring a current through the dielectric layer after each of the constant voltage pulses has been applied.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
  providing a device having a dielectric layer;
  applying a plurality of constant voltage pulses to said device, wherein each of said voltage pulses are at the same voltage level; and
  determining a time-to-breakdown for said dielectric layer based upon a count of the number of pulses applied to said device to break down said dielectric layer.

2. The method of claim 1, further comprising measuring a current through said dielectric layer after one or more of said constant voltage pulses has been applied.

3. The method of claim 1, further comprising measuring a current through said dielectric layer after each of said plurality of constant voltage pulses has been applied.

4. The method of claim 1, wherein said time-to-breakdown is determined based upon a measurement of current flowing through said dielectric layer, said current being measured after one or more of said constant voltage pulses has been applied.

5. The method of claim 1, wherein said device is comprised of at least one of a transistor, a capacitor, a resistor and a memory cell.

6. The method of claim 1, wherein said dielectric layer is comprised of silicon dioxide or a material having a dielectric constant greater than 5.

7. The method of claim 1, wherein said constant voltage pulses have a voltage that ranges from approximately 4–5 volts.

8. The method of claim 1, wherein said pulses have a constant pulse width.

9. The method of claim 1, wherein said pulses have a constant pulse width of less than 1 μsec.

10. The method of claim 1, wherein said pulses have a constant pulse width of approximately 100 ns.

11. The method of claim 2 or 3, wherein said step of measuring said current through said dielectric layer is performed using an applied voltage of approximately 1–2 volts.

12. The method of claim 1, wherein said device is a transistor and said dielectric layer is a gate insulation layer for said transistor.

13. The method of claim 1, wherein said dielectric layer is an interlevel or intralevel dielectric layer of a conductive interconnection structure.

14. The method of claim 1, further comprising:
determining at least one parameter of a process operation to be performed to form a dielectric layer on at least one subsequently processed substrate based upon said determined time-to-breakdown.

15. The method of claim 14, further comprising:
performing said process operation comprised of said determined at least one parameter on said at least one subsequently processed substrate to form said dielectric layer above said at least one subsequently processed substrate.

16. The method of claim 14, wherein determining said at least one parameter comprises determining at least one of a temperature, a pressure, a duration, a process gas composition, a process gas concentration, and an applied voltage of said at least one process operation.

17. The method of claim 14, wherein said at least one process operation comprises at least one of a deposition process, a thermal growth process and a nitridation process.

18. The method of claim 1, wherein said device is part of a test structure formed on a semiconducting substrate.

19. A method, comprising:
providing a device having a dielectric layer;
applying a plurality of constant voltage pulses to said device, wherein said pulses have a constant pulse width and wherein each of said voltage pulses are at the same voltage level;
determining a time-to-breakdown for said dielectric layer based upon a count of the number of pulses applied to said device to break down said dielectric layer; and
determining at least one parameter of a process operation to be performed to form a dielectric layer on at least one subsequently processed substrate based upon said determined time-to-breakdown.

20. The method of claim 19, further comprising:
performing said process operation comprised of said determined at least one parameter on said at least one subsequently processed substrate to form said dielectric layer above said at least one subsequently processed substrate.

21. The method of claim 19, wherein determining said at least one parameter comprises determining at least one of a temperature, a pressure, a duration, a process gas composition, a process gas concentration, and an applied voltage of said at least one process operation.

22. The method of claim 19, wherein said at least one process operation comprises at least one of a deposition process, a thermal growth process and a nitridation process.

23. A method, comprising:
providing a device having a dielectric layer;
applying a plurality of constant voltage pulses to said device, wherein said constant voltage pulses have a voltage that ranges from approximately 4–5 volts and wherein each of said voltage pulses are at the same voltage level;
determining a time-to-breakdown for said dielectric layer based upon a count of the number of pulses applied to said device to break down said dielectric layer; and
determining at least one parameter of a process operation to be performed to form a dielectric layer on at least one subsequently processed substrate based upon said determined time-to-breakdown.

24. The method of claim 23, further comprising:
performing said process operation comprised of said determined at least one parameter on said at least one subsequently processed substrate to form said dielectric layer above said at least one subsequently processed substrate.

25. The method of claim 23, wherein determining said at least one parameter comprises determining at least one of a temperature, a pressure, a duration, a process gas composition, a process gas concentration, and an applied voltage of said at least one process operation.

26. The method of claim 23, wherein said at least one process operation comprises at least one of a deposition process, a thermal growth process and a nitridation process.

* * * * *